(12) United States Patent
Sun et al.

(10) Patent No.: US 7,785,666 B1
(45) Date of Patent: Aug. 31, 2010

(54) METHODS FOR FABRICATING A MAGNETIC RECORDING DEVICE

(75) Inventors: Hai Sun, Milpitas, CA (US); Liubo Hong, San Jose, CA (US); Hongping Yuan, Fremont, CA (US); Yizhong Wang, Woodbury, MN (US); Winnie Yu, San Jose, CA (US); Xianzhong Zeng, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 66 days.

(21) Appl. No.: 11/955,266

(22) Filed: Dec. 12, 2007

(51) Int. Cl.
*B05D 1/32* (2006.01)
(52) U.S. Cl. .......... 427/282; 264/494; 360/15; 360/48; 360/51
(58) Field of Classification Search ............ 427/282
See application file for complete search history.

(56) References Cited

U.S. PATENT DOCUMENTS

| 5,773,871 | A * | 6/1998 | Boyd et al. ............... 257/532 |
| 6,540,928 | B1 * | 4/2003 | Kobrin et al. ............. 216/22 |
| 7,041,436 | B2 | 5/2006 | Krause et al. |
| 7,077,992 | B2 | 7/2006 | Sreenivasan et al. |
| 2003/0017424 | A1 * | 1/2003 | Park et al. ............... 430/322 |
| 2003/0112655 | A1 * | 6/2003 | Hosotani ................. 365/158 |
| 2006/0132953 | A1 * | 6/2006 | Asakura et al. ............ 360/48 |

OTHER PUBLICATIONS

Gary M. McLelland et al., "Nanoscale patterning of magnetic islands by imprint lithography using a flexible mold", Applied Physics Letters, Aug. 19, 2002, vol. 81, No. 8, American Institute of Physics, pp. 1483-1485, US.
Ahopelto et al., Alternative Lithography, Kluwer Academic Publishers, 446 pages, US.
S.C. Johnson et al., "Advances in Step and Flash Imprint Lithography", SPIE, 6 pages, US.

* cited by examiner

*Primary Examiner*—Michael Kornakov
*Assistant Examiner*—Xiao Zhao

(57) ABSTRACT

A method and system for fabricating a magnetic recording device are described. The method and system include providing a mask layer on the magnetic recording device and imprinting a pattern in the mask layer to form a mask. The method and system also include transferring the pattern from the mask to the magnetic recording device. In another aspect, the method and system include providing a malleable mask layer on the magnetic recording device. In this aspect, the method and system also include depressing an imprint mask into the mask layer and curing the mask layer while the imprint mask is depressed into the mask layer to provide a mask having a pattern. The pattern may correspond to a read sensor and/or a perpendicular magnetic recording pole. The method and system also include transferring the pattern from the mask to the magnetic recording device.

20 Claims, 7 Drawing Sheets

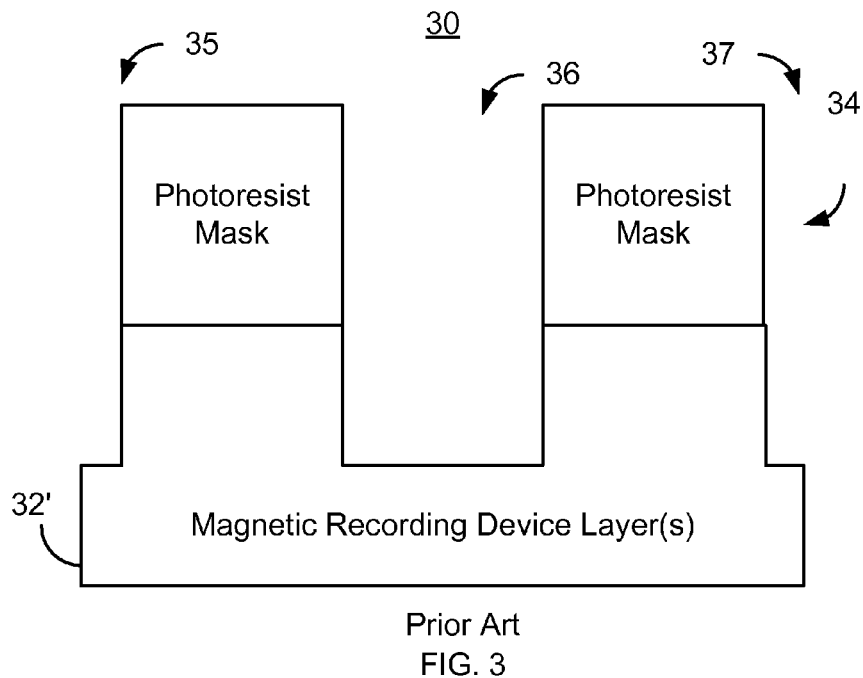
Prior Art
FIG. 3
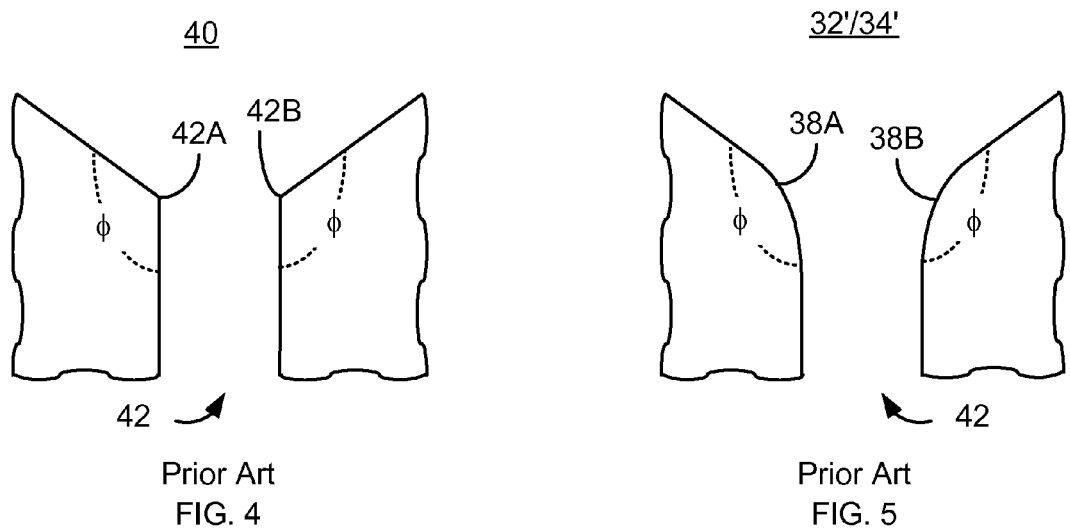
Prior Art
FIG. 4
Prior Art
FIG. 5

METHODS FOR FABRICATING A MAGNETIC RECORDING DEVICE

BACKGROUND

FIG. 1 depicts a conventional method 10 for fabricating a conventional magnetic recording device, such as a read or write transducer. FIGS. 2-5 depict the conventional magnetic recording device 30 during fabrication using the conventional method 10 as well as a mask that may be used in fabricating the conventional magnetic recording device 30. For clarity, the conventional magnetic recording device 30 is not to scale. Referring to FIGS. 1-5, the conventional magnetic recording device 30 is fabricated using photolithography. Thus, a photoresist layer is provided, via step 12. The photoresist layer is exposed to light with a mask (not shown) in place, via step 14. A photoresist mask having aperture(s) therein is thus formed in step 14. FIG. 2 depicts the conventional magnetic recording device 30 as viewed from the air-bearing surface (ABS) after step 14 is completed. Thus, a conventional magnetic recording device layer(s) 32 and photoresist mask 34 are shown. The magnetic recording device layer(s) might include material(s) used in forming a read sensor, an underlayer on which a pole is to be formed, and/or other layers for the magnetic recording device 30. A pattern is defined by the conventional photoresist mask 34. For example, the photoresist mask 34 is depicted as including apertures 35, 36, and 37 therein. Consequently, a portion of the underlying magnetic recording device layer(s) 32 is exposed.

The pattern of the conventional photoresist mask 34 is transferred to the magnetic recording device 30, via step 16. Step 16 might include removing a portion of the underlying magnetic recording device layer(s) 32 and/or depositing additional layers. Thus, steps 12-16 may be taken when utilizing conventional photolithography in forming the conventional magnetic recording device 30. FIG. 3 depicts the conventional PMR head 30 after step 16 is completed. In the conventional magnetic recording device 30 shown, portions of the magnetic recording device layer(s) 32 have been removed. Consequently, magnetic recording device layer(s) 32' remain. Fabrication of the conventional PMR head 30 may then be completed.

Although the conventional method 10 may be used to form the conventional magnetic recording device 30, there may be drawbacks. Structures formed for the conventional magnetic recording device 30 are desired to be extremely small, particularly at higher densities. Thus, high resolution and a tight overlay are desired in fabricating the conventional magnetic recording device 30. Such specifications may require the use of state-of-the art photolithography tools. Such tools are typically very expensive. For example, some systems may be tens of millions of dollars in cost.

Optical proximity effects may also adversely affect fabrication of the conventional magnetic recording device 30 using the conventional method 10. Such optical proximity effects may cause the shapes of the structures to be poorly controlled. For example, FIG. 4 depicts a conventional mask 40 used in fabricating a pole. The mask 40 may be used in step 12 to expose portions of the photoresist layer to form the photoresist mask 34. FIG. 5 depicts the conventional photoresist mask 34' and, therefore, the conventional magnetic recording device layer(s) 32' formed using the conventional photoresist mask 34'. Referring to FIGS. 4-5, the conventional mask 40 includes relatively sharp corners 42A and 42B. However, the corresponding regions of the conventional photoresist mask/conventional magnetic layers 34'/32', arcs 38A and 38B, are rounded. It is believed that this rounding is due to optical proximity effects during exposure of the resist mask 40. Even though the desired obtuse angle, $\phi$, may be achieved, the rounding adversely affects the performance of the magnetic recording device 30. For example, variations in the write track width and shape of the pole formed using the photoresist mask/magnetic layers 34'/32' may result. Consequently, performance of the conventional magnetic recording device may suffer.

BRIEF SUMMARY OF THE INVENTION

A method and system for fabricating a magnetic recording device are described. The method and system include providing a mask layer on the magnetic recording device and imprinting a pattern in the mask layer to form a mask. The method and system also include transferring the pattern from the mask to the magnetic recording device.

BRIEF DESCRIPTION OF SEVERAL VIEWS OF THE DRAWINGS

FIGS. 2-3 depict a conventional magnetic recording device during fabrication.

FIG. 4 depicts a conventional mask used in fabrication of a conventional magnetic recording device.

FIG. 5 depicts a conventional photoresist mask and/or magnetic layers during fabrication of a conventional magnetic recording device.

DETAILED DESCRIPTION OF THE PREFERRED EMBODIMENTS

Figure 1:
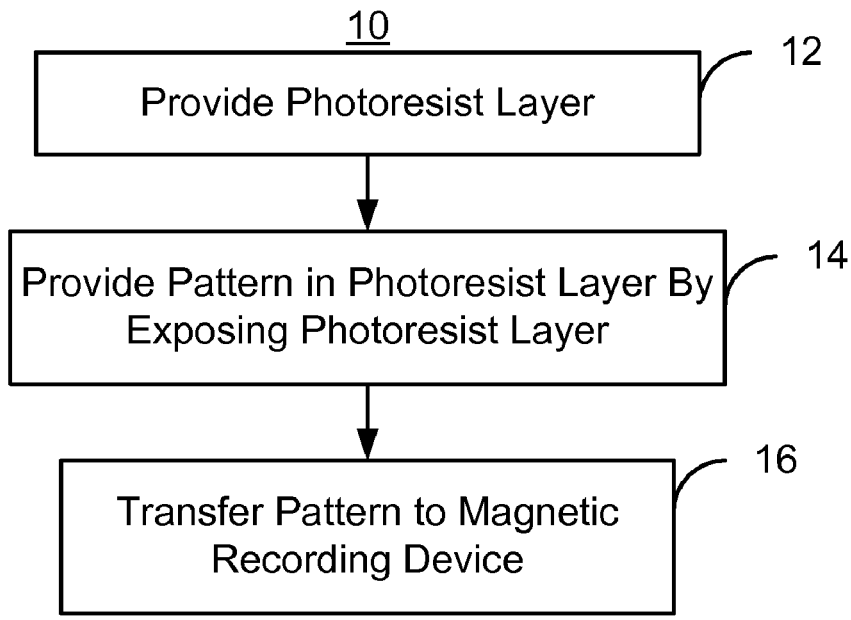
FIG. 1 is a flow chart depicting a conventional method for providing a conventional magnetic recording device.
Figure 2:
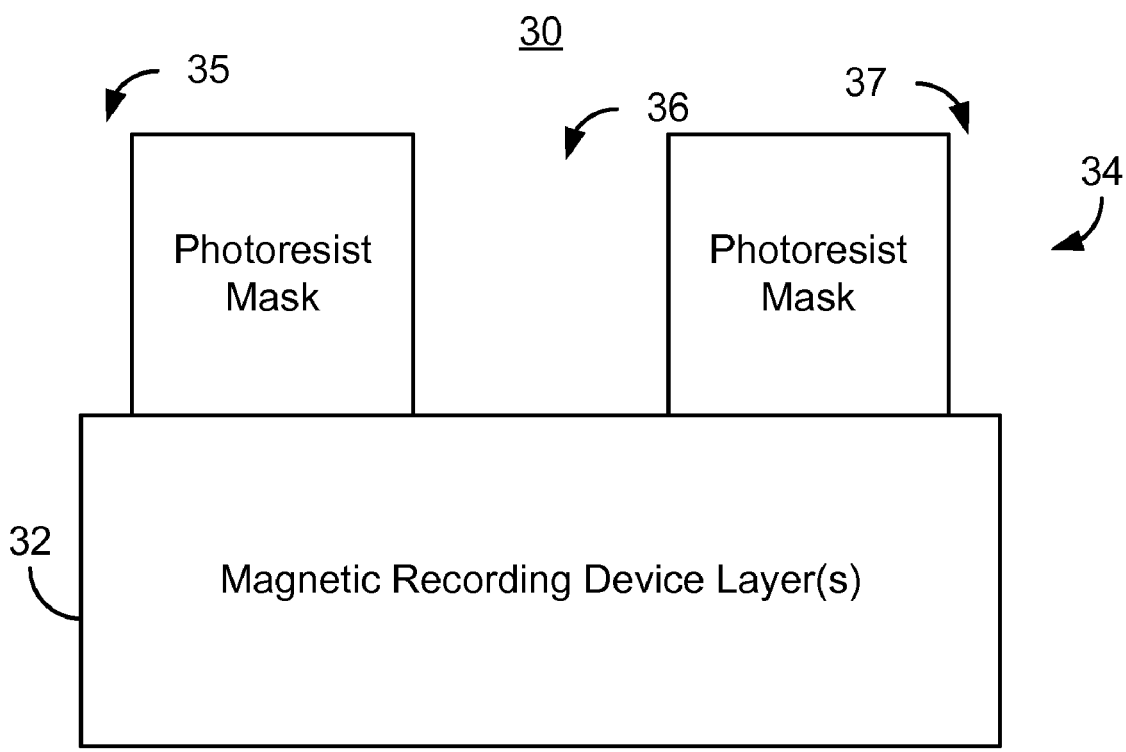
Figure 6:
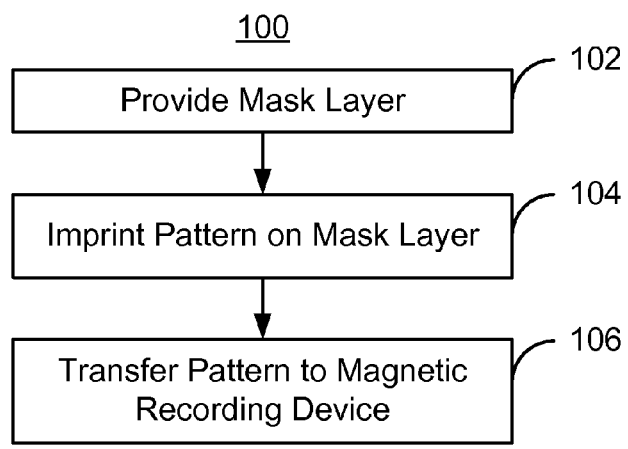
FIG. 6 is a flow chart depicting an exemplary embodiment of a method for providing a magnetic recording device.

FIG. 6 is a flow chart depicting an exemplary embodiment of a method 100 for fabricating at least a portion of a magnetic recording device, such as a pole or a read sensor. For simplicity, some steps in the method 100 may be omitted. Consequently, other and/or additional steps not inconsistent with the method and system may be used. The method 100 is described in the context of and may be used for providing particular structures in a read or write transducer. However, in another embodiment, the method 100 may be used in providing another structure that may be in another type of head. FIGS. 7-10 depict an exemplary embodiment of a magnetic recording device 120 during fabrication. For simplicity, the magnetic recording device 120 and its components are not to scale. For clarity, the mask shown may be used for fabrication of a single recording device. However, a single mask is generally used in fabricating numerous magnetic devices simultaneously. For example, over one thousand devices in a flash field on a wafer may be fabricated using a single mask. In addition, because lower density features may be readily fabricated, only one feature is shown on the mask. However, the method and system might be used to fabricate more than one structure in a magnetic recording device.

Figure 7:
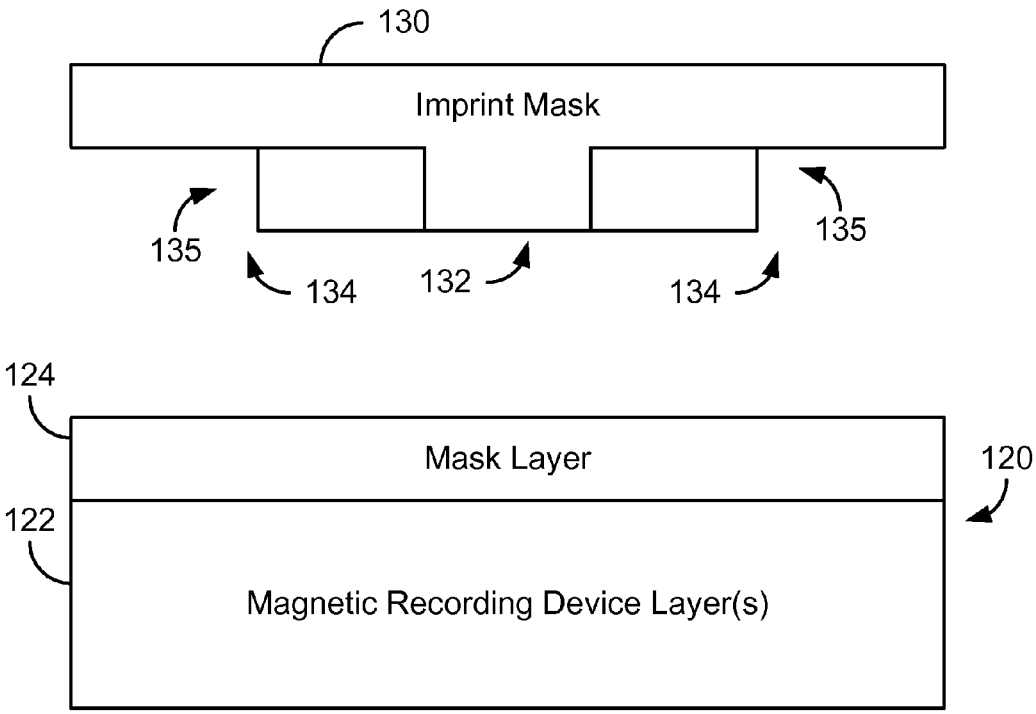
FIGS. 7-10 depict an exemplary embodiment of a magnetic recording device during fabrication.

Referring to FIGS. 6-10, a mask layer is provided on the magnetic recording device, via step 102. The mask layer is malleable. For example, in one embodiment, the mask layer may be a liquid. In such an embodiment, the mask layer may be viscous. In another embodiment, the mask layer may at least partially solid. In either embodiment, the mask layer is sufficiently pliable to undergo imprinting, described below. FIG. 7 depicts the magnetic recording device 120 after step 102 is performed. Magnetic recording device layer(s) 122 and a mask layer 124 are shown. In one embodiment, the mask layer 124 is a layer of resist. Also shown in FIG. 7 is the imprint mask 130 to be used in fabricating the magnetic recording device 120. The imprint mask 130 includes a pattern that may be used, for example, for a read sensor and/or pole. The pattern in the imprint mask 130 is generally the mirror image of the pattern to be formed in the mask layer 124. For example, the imprint mask 130 includes ridge 132 where apertures are desired in the mask layer 124 and depressions 134 where portions of the mask layer 124 are desired to remain. Also shown in the imprint mask 130 are features 135 that extend into the plane of the page. The features 135 indicate that the imprint mask 130 need not be used only to rectangular features, such as lines. For example, the imprint mask 130 might be used for formation of a perpendicular magnetic recording pole. In addition, the imprint mask 130 is used to print aperture(s) in a mask. In another embodiment, line(s) could be printed.

A pattern is imprinted in the mask layer 124 to form a mask, via step 104. Thus, step 104 utilizes the imprint mask 130. In one embodiment, step 104 includes placing the imprint mask 130 in physical contact with the mask layer 124 such that the pattern is formed in the mask layer 124. For example, where the mask layer is malleable, not rigid, step 104 may include placing the imprint mask 130 in physical contact with the mask layer 124 and applying pressure to the imprint mask 130. Thus, the imprint mask 130 is depressed into the mask layer 124. Step 104 may also include curing the mask layer 124 so that the mask layer 124 solidifies. Thus, in one embodiment, the mask layer 124 is cured while the imprint mask 130 is in physical contact with the mask layer 124. In one embodiment, curing could include a thermal cure. In another embodiment, an ultraviolet light cure could be used. In another embodiment, another cure and/or a combination of thermal curing and ultraviolet light curing might be used.

Figure 8:
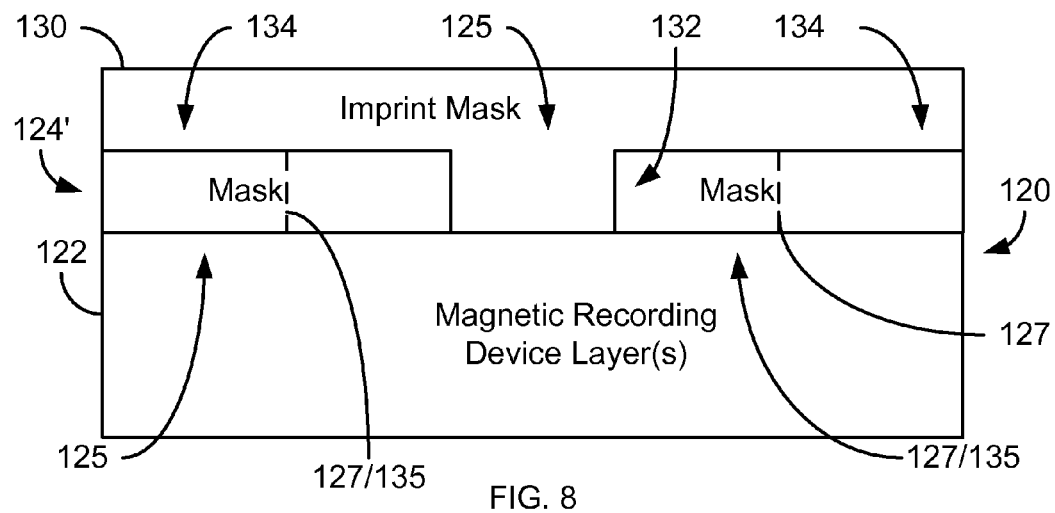

FIG. 8 depicts the magnetic recording device 120 after step 104 is completed. Thus, a mask 124' has been formed from the mask layer 124. The mask 124' includes aperture 125 corresponding to the ridge 132 of the imprint mask 130. Thus, a mask 124' has been formed from the imprint mask 130 and the mask layer 124 through imprinting. Dashed lines 127 indicate mask features within the plane of the page corresponding to features 135 of the imprint mask 130.

The pattern is transferred from the mask 124' to the magnetic recording device 120, via step 106. In one embodiment, the pattern transferred may correspond to the nose of a pole of a write transducer, such as a perpendicular magnetic recording (PMR) transducer. In an alternate embodiment, the pattern transferred might correspond to a read sensor for a read transducer.

The pattern may be transferred from the mask 124' to the magnetic recording device 120 in a number of ways. For example, the layer(s) 122 of the magnetic recording device 120 may be etched while the mask 124' is in place. For example, a reactive ion etch (RIE) or ion mill may be used to remove portions of the magnetic recording device layer(s) 122 exposed by the mask 124'. Such an embodiment may be used in formation of a read sensor. Similarly, trenches may be formed in regions of the magnetic recording device layer(s) 122 that are exposed by aperture 125 in the mask 124'. In another embodiment, transfer of the pattern step 104 may be a multi-step process. In one such embodiment, a hard mask might be provided in the aperture 125. The mask 124' may then be removed. The hard mask may then be used as a mask while portions of the underlying magnetic layer(s) 122 are removed, for example via an RIE or ion mill. Such an embodiment may be used in formation of a write transducer. In another embodiment, an additional layer may be deposited on the mask 124' and the mask may be removed. Consequently, portions of the layer residing in the aperture 125 may remain. In other embodiments, other and/or additional methods for transferring the pattern in the mask 124' to the magnetic recording device 120 may be used.

Figure 9:
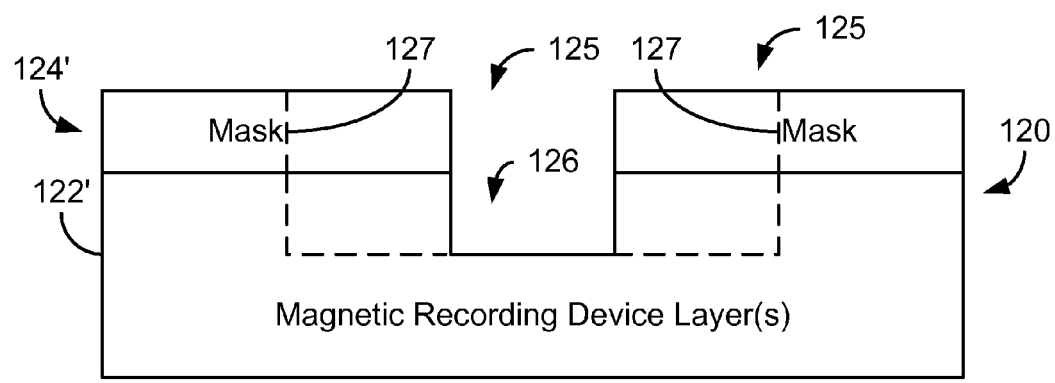
Figure 10:
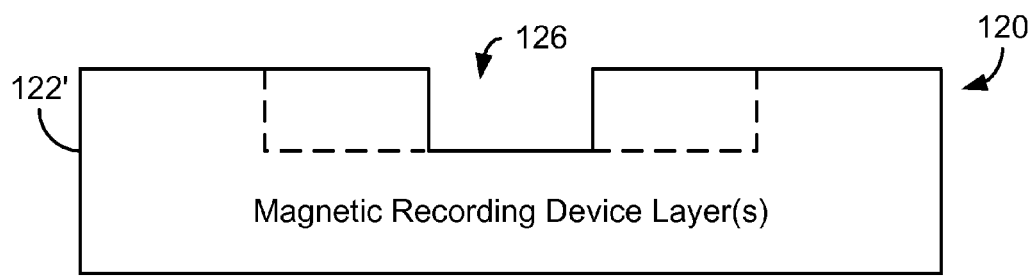

FIG. 9 depicts the magnetic recording device 120 after step 106 is performed. In the embodiment shown, portions of the underlying magnetic recording device layer(s) 122 have been removed. Thus, magnetic recording device layers 122' having trench 126 therein remain. Note that the trench 126 may extend completely through one or more of the magnetic recording device layer(s) 122'. FIG. 10 depicts the magnetic recording device 120 after the mask 124' has been removed. Thus, the magnetic recording device layers 122' having the pattern transferred from the mask 124' remain. Fabrication of the magnetic recording device 122' might then be completed.

Figure 11:
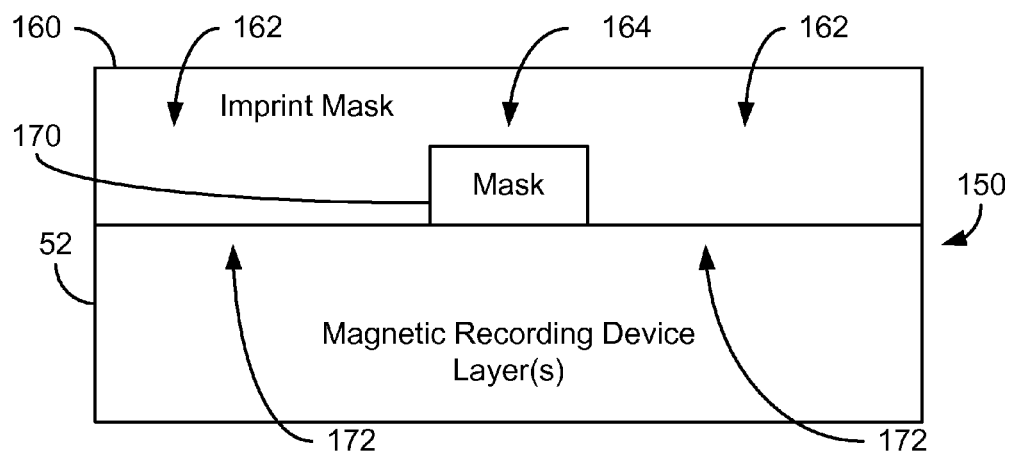
FIGS. 11-13 depict another exemplary embodiment of a magnetic recording device during fabrication.
Figure 12:
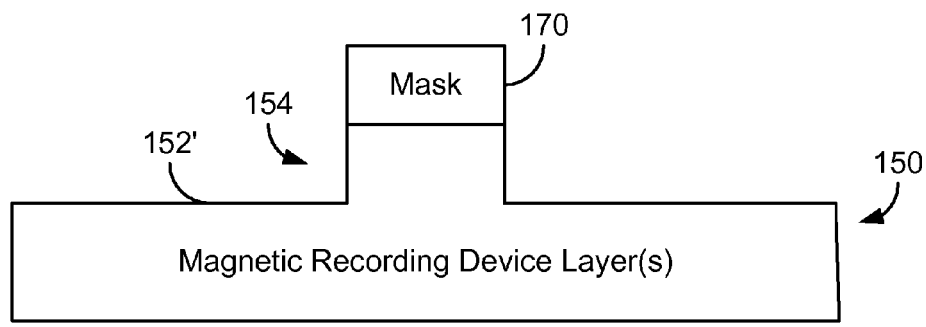
Figure 13:
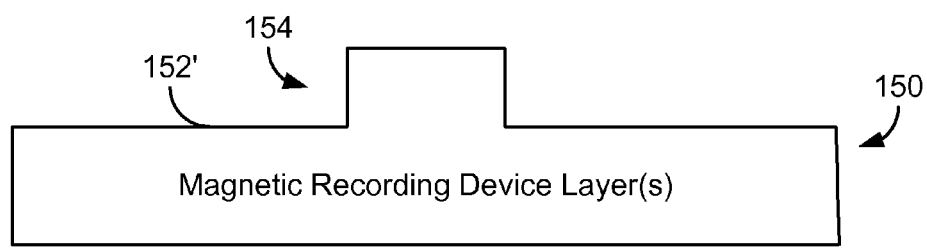

Thus, the method 100 and imprint mask 130 may be used for formation of a mask 124' including an aperture 125. Such a mask might be used in formation of a pole, for example by allowing deposition of a hard mask layer in the aperture 125 and/or formation of a trench 126. The method 100 might also be used to print lines. FIGS. 11-12 depict another exemplary embodiment of a magnetic recording device 150 during fabrication. The magnetic recording device 150 is analogous to the magnetic recording device 120. However, instead of using the imprint mask 130 to print a mask 124' having an aperture 125 therein, a line is imprinted. FIG. 11 depicts the magnetic recording device 150 after step 104 is completed. Thus, the magnetic recording device layers 152 are shown. Also depicted is the imprint mask 160 having ridges 162 and depression 164. The imprint mask 160 has been used to imprint a mask that includes a line 170. FIG. 12 depicts the magnetic recording device 150 after the pattern has been transferred in step 106. A portion of the magnetic recording device layer(s) has been removed, leaving a remaining portion 152'. The portion removed might extend through one or more of the magnetic recording device layer(s) 152'. Thus, a line 154 has been formed. FIG. 13 depicts the magnetic recording device 150 after the mask 170 has been removed.

Thus, using the method 100, a magnetic recording device 120/150 may be provided. Because imprinting is used to form the mask in step 104, the resolution may be improved. In particular, the imprint mask may have a higher resolution. As described below, the imprint mask may be formed using a direct write electron beam. The resolution of such an electron beam is higher than optical lithography. Because imprinting directly transfers the pattern from the imprint mask to the mask, this resolution may, to a large degree, be preserved. This improvement in resolution may be achieved without resort to extremely high cost tools, such as optical scanners. Consequently, relatively low cost imprinting may achieve a higher resolution.

Figure 14:
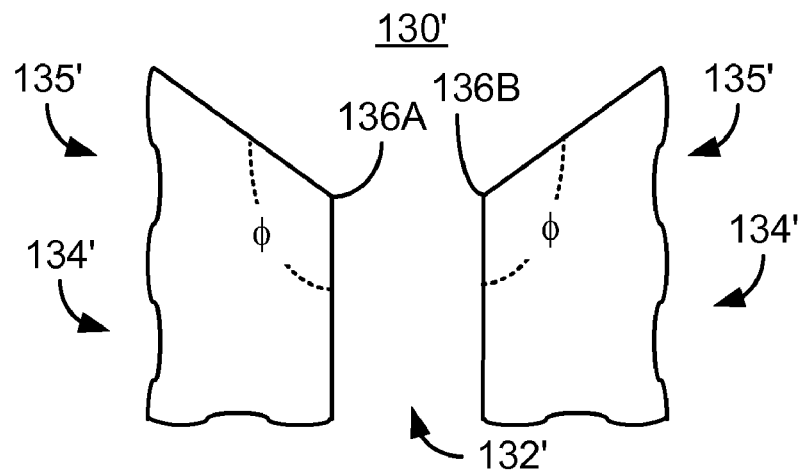
FIG. 14 depicts exemplary embodiment of an imprint mask for use in fabricating a magnetic recording device.
Figure 15:
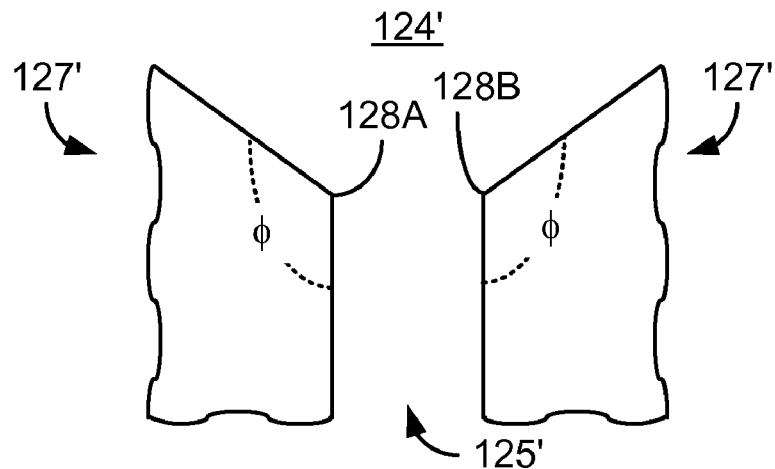
FIG. 15 depicts exemplary embodiment of a mask for a magnetic recording device formed using imprinting.
Figure 16:
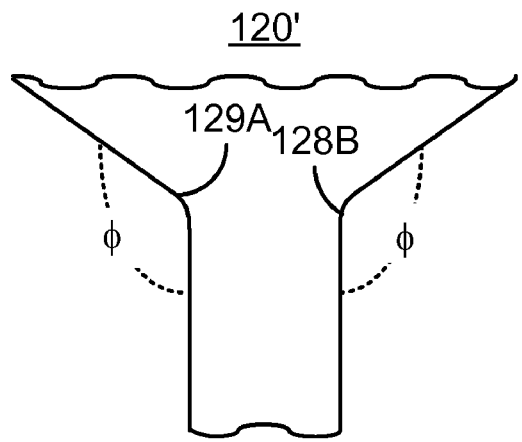
FIG. 16 depicts exemplary embodiment of a magnetic recording device during fabrication.

Optical effects may also be reduced using the method 100. For example, FIG. 14 depicts exemplary embodiment of an imprint mask 130' for use in fabricating a magnetic recording device. The imprint mask 130' might be used in fabricating a pole for a write transducer. The imprint mask 130' corresponds to the imprint mask 130. Thus, features 135' as well as ridges 132' and apertures 134' are shown. The imprint mask 130' includes corners 136A and 136B. FIG. 15 depicts exemplary embodiment of a mask 124" for a magnetic recording device formed using imprinting. The mask 124" corresponds to the mask 124' and thus includes aperture 125' and features 127' that correspond to aperture 125 and dashed lines 127, respectively. The mask 124' includes corners 128A and 128B. The corners 128A and 128B corresponding to the corners 136A and 136B, respectively. Because the mask 124" was formed via imprinting, rounding of the corners 128A and 128B may be reduced or eliminated. FIG. 16 depicts exemplary embodiment of a magnetic recording device 100' during fabrication. The magnetic recording device 100' is formed using the imprint mask 130'and mask 124". The magnetic recording device 120' corresponds to the magnetic recording device 120 and includes corners 129A and 129B. The corners 129A and 129B correspond to the corners 128A and 128B, respectively. Because the corners 128A and 154 of the mask 124' are not rounded, the pattern transferred to the magnetic recording device 120' also exhibits less rounding of the corners 129A and 129B. In one embodiment, the rounding of the corners 129A and 129B may be substantially eliminated. The performance of the magnetic recording device 120' may thereby be improved. Thus, the method 100 may allow for the fabrication of a magnetic recording device 120/120'/150 at lower cost and higher quality, including higher resolution and reduced corner rounding.

The method 100 may also have particular utility for portions of the magnetic device 100 having high resolution. For example, the method 100 might be particularly beneficial when used in defining a read sensor or nose for a pole such as a PMR pole. Some imprint tools may not have as tight overlay as expensive optical scanners. Thus, the method 100 may also have particular utility for those structures in the magnetic recording device 100/160 that have high resolution without requiring the tightest overlay. Furthermore, the method 100 may be used judiciously, for example only on those structures for which high resolution is desired. In such a case, any increase in time for performing the method 100 may not significantly affect throughput for the entire magnetic recording device 120. Thus, improved resolution may be achieved at a reasonable cost and without significant decrease in throughput.

Figure 17:
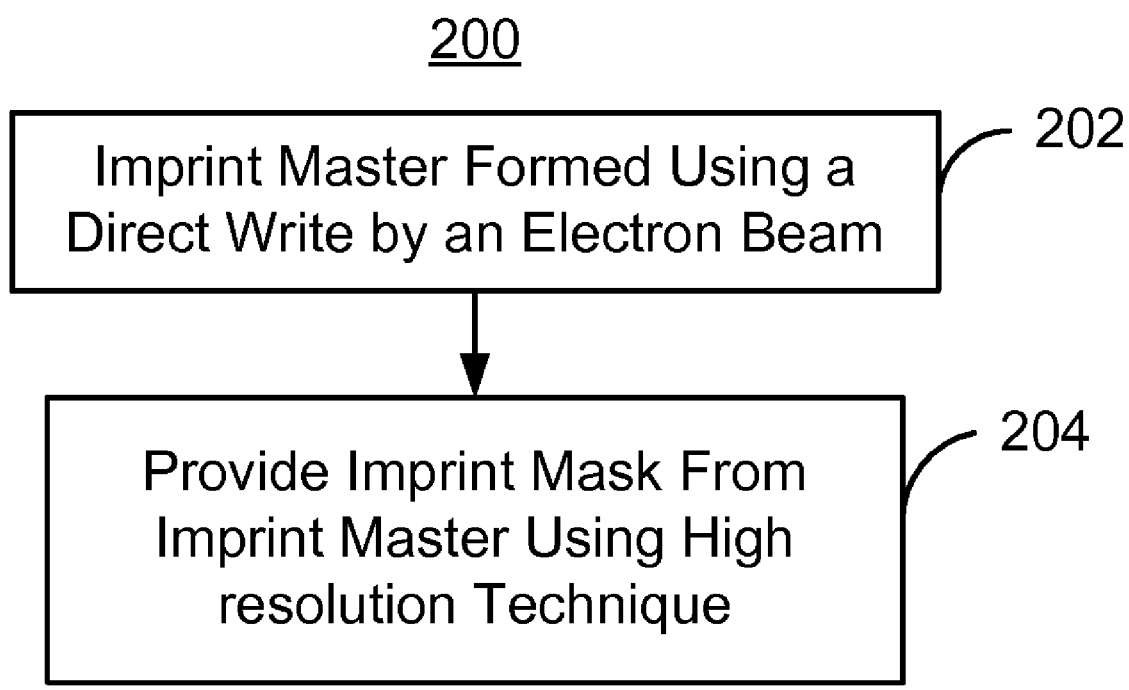
FIG. 17 is a flow chart depicting an exemplary embodiment of a method for providing an imprint mask.

As discussed above, the method 100 may have improved resolution because the imprint mask 130 and, therefore, the mask 124' may have improved resolution. In one embodiment, the imprint mask 130 may itself be formed by directly writing to the material for the imprint mask 130 using an electron beam. However, in another embodiment, the imprint mask 130 may be formed in another manner. For example, FIG. 17 is a flow chart depicting an exemplary embodiment of a method 200 for providing an imprint mask. The method 200 is described in the context of the imprint mask 130. However, the method 200 may be used for another imprint mask. For simplicity, some steps in the method 100 may be omitted. Consequently, other and/or additional steps not inconsistent with the method and system may be used.

An imprint master is formed using a direct write by an electron beam, via step 202. Thus, the imprint master has the resolution of the electron beam used. This resolution may be higher than resolution available using optical photolithography. Other high-resolution techniques for forming the pattern of the imprint master that are currently known or later developed could also be used.

The imprint mask 130 is provided from the imprint master using a high resolution technique, via step 204. In one embodiment, step 204 includes imprinting the imprint mask 130 from the imprint master. For example, in one embodiment, step 204 includes placing the imprint master in physical contact with an imprint mask layer (not shown) such that the pattern is formed in the imprint mask layer. For example, where the imprint mask layer is malleable, not rigid, step 204 may include placing the imprint master in physical contact with the imprint mask layer and applying pressure to the imprint master. Thus, the imprint master is depressed into the imprint mask layer. Step 204 may also include curing the imprint mask layer so that the imprint mask layer solidifies. Thus, in one embodiment, the imprint mask layer is cured while the imprint master is in physical contact with the imprint mask layer. In one embodiment, curing could include a thermal cure. In another embodiment, an ultraviolet light cure could be used. In another embodiment, another cure and/or a combination of thermal curing and ultraviolet light curing might be used. The imprint master is then separated from the imprint mask layer. Thus, the imprint mask 130 is left.

Because imprinting is used, the high resolution of the imprint master is transferred to the imprint mask 130. Consequently, an imprint mask 130 may have a resolution substantially equal to that of the imprint master. Consequently, the high resolution imprint mask 130 may be formed relatively inexpensively and easily produced. Moreover, this process may be performed multiple times in order to provide numerous imprint masks 130 from a single electron beam defined imprint master.

Using the method 100, a magnetic device 120/160 having improved resolution may be provided. For example, a read sensor and/or portions of a write transducer may be provided using the method 100. Moreover, the higher resolution structures may be provided without incurring substantial additional expense or reduction in throughput. Consequently, performance of the magnetic recording device head 120/160 may be improved.

We claim:

1. A method for fabricating a magnetic recording transducer comprising:
   providing a mask layer on the magnetic recording transducer;
   placing an imprint mask in physical contact with the mask layer and imprinting a pattern in the mask layer to form a mask from the mask layer;
   transferring the pattern from the mask to the magnetic recording transducer.

2. The method of claim 1 wherein the mask layer is not rigid, wherein the imprint mask corresponds to the pattern.

3. The method of claim 2 wherein the mask layer is liquid.

4. The method of claim 2 wherein the imprinting further includes:
   curing the mask layer while the imprint mask is in physical contact with the mask layer.

5. The method of claim 4 wherein the curing further includes a thermal cure.

6. The method of claim 4 wherein the curing further includes an ultraviolet light cure.

7. The method of claim 1 wherein the imprinting further includes: forming the imprint mask using an electron beam.

8. The method of claim 7 wherein the step of forming the imprint mask further includes:

forming an imprint master using the electron beam; and
providing the imprint mask from the imprint master.

9. The method of claim 8 wherein the step of providing the imprint mask pattern further includes:
imprinting the imprint mask from the imprint master.

10. The method of claim 1 wherein the pattern corresponds to at least one read sensor and wherein the magnetic recording transducer is a read transducer.

11. The method of claim 1 wherein the magnetic recording transducer is a write transducer and the pattern corresponds to a nose of a pole of the write transducer.

12. The method of claim 11 wherein the write transducer is a perpendicular magnetic recording transducer.

13. The method of claim 1 wherein the mask resides on a layer and includes an aperture therein, the aperture exposing a portion of the layer, and wherein the step of transferring the pattern further includes:
etching the portion of the layer to form a trench therein.

14. The method of claim 1 wherein the mask resides on a layer and includes an aperture therein, the aperture exposing a first portion of the layer, and wherein the step of transferring the pattern further includes:
depositing a hard mask in the aperture, the hard mask covering the first portion of the layer and exposing a second portion of the layer;
removing the mask; and
removing the second portion of the layer exposed by the hard mask.

15. The method of claim 14 wherein the step of removing further includes:
performing an ion mill.

16. The method of claim 14 wherein the step of removing further includes:
performing a reactive ion etch.

17. The method of claim 1 wherein the mask resides on a layer and exposes a portion of the layer, and wherein the step of transferring the pattern further includes:
removing the portion of the layer.

18. The method of claim 1 wherein the step of transferring the pattern further includes:
depositing a layer after the mask is imprinted; and
removing the mask, a portion of the layer residing on the mask being removed.

19. A method for fabricating a magnetic recording device comprising;
providing a mask layer on the magnetic recording device, the mask layer being malleable, the magnetic recording device being at least one of a read transducer and a write transducer;
depressing an imprint mask into the mask layer to form a pattern in the mask layer, the pattern corresponding to at least one of a read sensor and a perpendicular magnetic recording pole;
curing the mask layer while the imprint mask is depressed into the mask layer to provide a mask having the pattern; and
transferring the pattern from the mask to the magnetic recording device.

20. The method of claim 17 wherein the mask layer is liquid.

* * * * *